(12) United States Patent
Rein et al.

(10) Patent No.: US 7,176,758 B2
(45) Date of Patent: Feb. 13, 2007

(54) MULTI-STAGE OUTPUT BUFFER

(75) Inventors: Hans-Martin Rein, Witten (DE); Hao Li, Bochum (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/934,164

(22) Filed: Sep. 3, 2004

(65) Prior Publication Data
US 2006/0049871 A1    Mar. 9, 2006

(51) Int. Cl.
*H03F 3/45*    (2006.01)
(52) U.S. Cl. ........................ 330/252; 330/261
(58) Field of Classification Search ................ 330/283, 330/305
See application file for complete search history.

(56) References Cited

U.S. PATENT DOCUMENTS

| | | | | |
|---|---|---|---|---|
| 5,254,956 | A * | 10/1993 | Nishijima | 330/258 |
| 5,815,034 | A * | 9/1998 | Takahashi | 327/563 |
| 6,275,110 | B2 * | 8/2001 | Kung | 330/261 |
| 6,731,182 | B2 | 5/2004 | Sakurai | |
| 6,750,727 | B1 | 6/2004 | Sutardja | |
| 2004/0108908 | A1 | 6/2004 | Lazarescu et al. | |
| 2005/0104661 | A1 * | 5/2005 | Rokugawa et al. | 330/253 |

FOREIGN PATENT DOCUMENTS

SU    617735 A    *    7/1978

OTHER PUBLICATIONS

"40Gbit/s transimpedance amplifier in SiGe bipolar technology for the receiver in optical-fibre TDM links", J. Müllrich. T.F. Meister, M. Rest, W. Bogner, A Schöpflin and H-M. Rein, Electronics Letters, 5th Mar. 1998, vol. 34, No. 5, 2 pgs.

"Wafer Level Integration of a 24 GHz and 34 GHz Differential SiGe-MMIC Oscillator with a Loop Antenna on a BCB Membrane", P. Abele, J. Konle, D. Behammer, E. Sömmez, K.-B. Schad, A. Trasser and H. Schumacher, 2003 IEEE MTT-S Digest, pp. 1033-1036.

"Single-Chip 20-GHz VCO and Frequency Divider in SiGe Technology", K. Ettinger, A. Stelzer, C. G. Diskus, W. Thomann, J. Fenk and R. Weigel. 2002 IEEE MTT-S Digest, pp. 835-838.

(Continued)

*Primary Examiner*—Robert Pascal
*Assistant Examiner*—Alan Wong
(74) *Attorney, Agent, or Firm*—Eschweiler & Associates, LLC

(57) ABSTRACT

A multi-stage output buffer is disclosed. The output buffer includes an emitter follower circuit coupled to a differential input that is configured to provide a substantially high input impedance at an input thereof, and provide a substantially low output impedance at an output thereof. An emitter coupled pair circuit is coupled to the output of the emitter follower circuit, and is configured to amplify the signal and further isolate an input circuit. The buffer further includes a base-grounded configuration transistor circuit coupled to an output of the emitter coupled pair circuit and having an output coupled to the differential output of the multi-stage output buffer. The base-grounded transistor circuit reduces a load impedance at the output of the emitter coupled pair circuit, improves decoupling of the external load from an input circuit when coupled thereto, and increases the output power.

25 Claims, 6 Drawing Sheets

OTHER PUBLICATIONS

"Millimeter-Wave VCOs With Wide Tuning Range and Low Phase Noise, Fully Integrated in a SiGe Bipolar Production Technology", Hao Li and Hans-Martin Rein, IEEE Journal of Solid-State Circuits, vol. 38, No. 2, Feb. 2003, pp. 184-191.

"47 GHz VCO With Low Phase Noise Fabricated in a SiGe Bipolar Production Technology", H. Li, H.-M. Rein, R. Kreienkamp and W. Klein, IEEE Microwave and Wireless Components Letters, vol. 11, No. 3, Mar. 2002, pp. 79-81.

* cited by examiner

FIG. 5A  FIG. 5C  FIG. 5D

MULTI-STAGE OUTPUT BUFFER

REFERENCE TO RELATED APPLICATIONS

This application is related to U.S. application Ser. Nos. 10/934,168, which were both filed on Sep. 3, 2004, the entirety of which are hereby incorporated by reference.

FIELD OF INVENTION

The present invention relates generally to an output buffer for use in communications or sensor applications for providing effective decoupling between a circuit coupled thereto and an external load, as well as providing high output power.

BACKGROUND OF THE INVENTION

Voltage controlled oscillators (VCOs) are generally used in high-frequency communication or sensor systems, for example, as an oscillator for a frequency synthesizer or a modulator within a wireless communication apparatus. As illustrated in prior art FIG. 1, a voltage controlled oscillator 10 receives an input or tuning voltage 12 and outputs a signal 14 having a frequency that is a function of the input voltage 12 to a load 16. Consequently, by altering the voltage at the input 12, one may tune the oscillation frequency at the output 14.

In many instances, the performance of a telecommunications device is limited by the phase noise of the oscillator circuit, wherein phase noise may be described generally as the random variation in the phase or frequency of the output signal. Consequently, the phase noise may place a limit on the precision of the oscillator output frequency. On the other hand, an oscillator with a reduced phase noise indicates that the oscillator produces a lower amount of spurious energy outside the desired frequency range of operation.

One type of voltage controlled oscillator is the inductive/capacitive (LC) oscillator. One example of an LC oscillator is illustrated in prior art FIG. 2, wherein a schematic diagram of a high frequency differential output LC type voltage controlled oscillator 20 is provided. The LC oscillator 20 is sometimes referred to as a negative-resistance oscillator because an input impedance between a base node of the transistors T and a virtual or AC ground has a negative real component and a capacitive reactance. The input impedance is influenced by a variable capacitance or varactor $C_{VAR}$ that facilitates a tuning of the oscillation frequency at the differential outputs Q and Q(bar). The inductance $L_B$ substantially completes the resonant circuit. The inductance $L_C$ matches the external load $R_L$ to the output of the transistor T to maximize the signal amplitude.

Circuit 20 of prior art FIG. 2 provides for some improvements over traditional millimeter-wave LC oscillators due to the inclusion of inductances $L_{E1}$ and $L_{E2}$. $L_{E2}$ facilitates the feeding of the bias current from the transistor T into a virtual ground or AC ground node, and consequently an output capacitance of a transistor current source 22 is not shunted to $C_{VAR}$ and thus prevents a reduction in the tuning range of the oscillator. In addition, the contribution of the current source 22 to the circuit's phase noise is reduced dramatically. $L_{E2}$ contributes to this advantage, together with the output capacitance of the current source 22, forms a low-pass LC filter that decouples high frequency noise generated by the current source 22 from the oscillator signal.

The addition of $L_{E1}$ increases the loaded quality factor $Q_L$ of the oscillator circuit 20 and thus reduces the phase noise thereof compared to a circuit having only a varactor $C_{VAR}$. In addition, the inductances $L_{E1}$, $L_{E2}$ and the capacitance $C_{VAR}$ are designed so that the admittance $Y_E$ of the total LC network that loads the emitter node of the transistor T is substantially capacitive within the entire oscillator frequency range of interest. The varactor $C_{VAR}$ in one example may comprise a base-collector type P-N junction that may be modified by an additional implant to provide a wised capacitance range. In addition, the inductances may comprise micro-strip lines formed in the metallization layers of an integrated circuit. The lengths of the micro-strip lines may be adjusted by clipping or cutting shorting bars associated therewith, thus altering the magnitude of the inductance.

The oscillator circuit 20 has an output matching network 24 that serves to optimize the load impedance at the collector nodes of the transistors T with respect to maximum output power and optimal loaded quality factor $Q_L$. The matching network 24 includes $L_C$, a bond pad capacitance $C_P$ and, if the circuit is mounted, a bond inductance $L_Q$. The matching network 24 couples to the external load $R_L$.

In some applications such an oscillator is employed as part of a monolithically integrated circuit or in a multi-chip module where the oscillator output Q and Q(bar) are directly bonded to a loading chip. In such instances, an output buffer is not required. However, if the oscillator output is loaded by a transmission line and such line is (as usual) not perfectly terminated, the performance of the oscillator circuit 20 is degraded. For example, such performance degradation may be evidenced by discontinuities in a plot of oscillation frequency versus varactor bias voltage (not shown) within the desired frequency operating range.

One solution to decouple the oscillator circuit 20 from the load is illustrated in prior art FIG. 3, wherein a base-grounded output buffer 30 is coupled to the collector terminals of the transistors T (forming a cascode stage). The output buffer 30 of prior art FIG. 3 provides some measure of decoupling of the oscillator circuit 20 from the load, however, the buffer 30 suffers from several disadvantages: there is no substantial signal amplification, the decoupling capability is often not sufficient at very high frequencies, it reduces the oscillation amplitude and the loaded quality factor of the oscillator core, thus increasing the phase noise, and a higher supply voltage is required.

Therefore there is a need in the art for improved voltage controlled oscillator systems and output buffers that overcome the deficiencies of the prior art.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an oscillator system comprising an oscillator circuit and an output buffer circuit associated therewith. The oscillator system provides a high frequency operation with high output power, low phase noise, and wide tuning range.

According to one aspect of the present invention, the oscillator system comprises an oscillator circuit that generates a differential output signal having a frequency that is a function of an input or tuning voltage. The oscillator system further comprises an output buffer circuit coupled to the oscillator circuit that decouples the oscillator circuit from the external load $R_L$ and increases the output power. The output buffer circuit includes an inductive voltage divider circuit that operates to weaken a loading at the oscillator differential output.

According to another aspect of the present invention, the inductive voltage divider circuit comprises a first and second pair of series-connected inductances coupled to the differential output of the oscillator circuit. An output of the inductive voltage divider circuit comprises a pair of nodes between the series-connected inductances of each pair. Depending upon a relative magnitude of the series-connected inductances, an optimization can be made between a reduced loading on the oscillator circuit (e.g., increased loaded quality factor and thus reduced phase noise) and increased signal amplitude at the buffer input. In addition, a total inductance of the series-connected inductances is selected to optimize a maximum signal amplitude at the oscillator core output.

According to yet another aspect of the present invention, the series-connected inductances of the inductive voltage divider comprise differential longitudinally extending micro-strip lines having one or more shorting conductors extending therebetween. By a selective cutting or removal of one or more shorting conductors, a magnitude of the inductances may be altered, thereby facilitating a tuning of the oscillator loading/amplitude optimization.

In accordance with still another aspect of the present invention, the output buffer further comprises an emitter follower circuit coupled to the inductive voltage divider. The emitter follower circuit is configured to provide a decoupling function between the oscillator output and any succeeding stages of the buffer. It operates as an impedance transformation circuit, wherein its substantially high input impedance reduces the loading of the oscillator and its substantially low output impedance improves the driving condition for any succeeding stages and thus the speed of the oscillator system.

In still another aspect of the invention, a signal amplifying circuit is provided in the output buffer, for example, in the form of a differential transadmittance stage or an emitter-coupled pair circuit. Since a decoupling function of the emitter follower circuit is decreased at high oscillator frequencies, the emitter-coupled pair also serves to provide improved decoupling between the oscillator circuit and the load.

According to yet another aspect of the present invention, the output buffer circuit further comprises a differential base-grounded transistor circuit coupled to the emitter-coupled pair to form a cascode stage. The base-grounded transistor circuit provides further decoupling of the oscillator circuit from the load and also operates to reduce a time constant at the output of the emitter coupled pair circuit, thereby improving the speed of the oscillator system. Moreover, due to the comparatively high breakdown voltage of the base-grounded transistor circuit configuration, the output signal and, thus, the maximum output power provided by the buffer can be increased.

According to another aspect of the invention, the output buffer further comprises a bias current circuit coupled between the emitter coupled pair circuit and the base-grounded transistor circuit. The bias current circuit is configured to provide a DC current such that active devices associated with the base-grounded transistor do not completely turn off when active devices associated with the emitter coupled pair circuit turn off. Consequently, the speed, linearity, and the signal amplitude (and thus the output power) of the output buffer is increased. In addition, the output buffer may further include an inductance coupled between the emitter coupled pair circuit and the base-grounded transistor. The additional inductance operates to provide improved impedance matching between the circuit elements, thereby further improving the output buffer amplitude and also the linearity of the output buffer.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIGS. 5A and 5C–5D are plan views of micro-strip transmission lines employed as trimmable inductances in accordance with an aspect of the present invention;

DETAILED DESCRIPTION OF THE INVENTION

Figure 1:
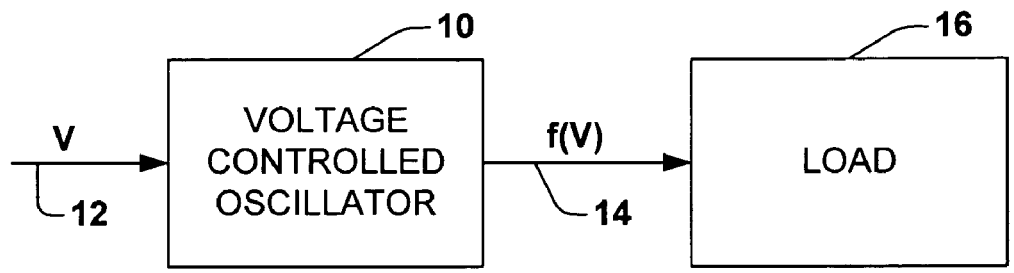
FIG. 1 is a block level diagram illustrating a voltage controlled oscillator system according to the prior art.

One or more implementations of the present invention will now be described with reference to the attached drawings, wherein like reference numerals are used to refer to like elements throughout. The invention relates to an oscillator system having an oscillator circuit and an output buffer. The output buffer operates in conjunction with the oscillator circuit to decouple the oscillator from an external load while providing high output power, optimization between signal amplitude and decreased loading (for improved quality factor), thus reducing phase noise.

Figure 2:
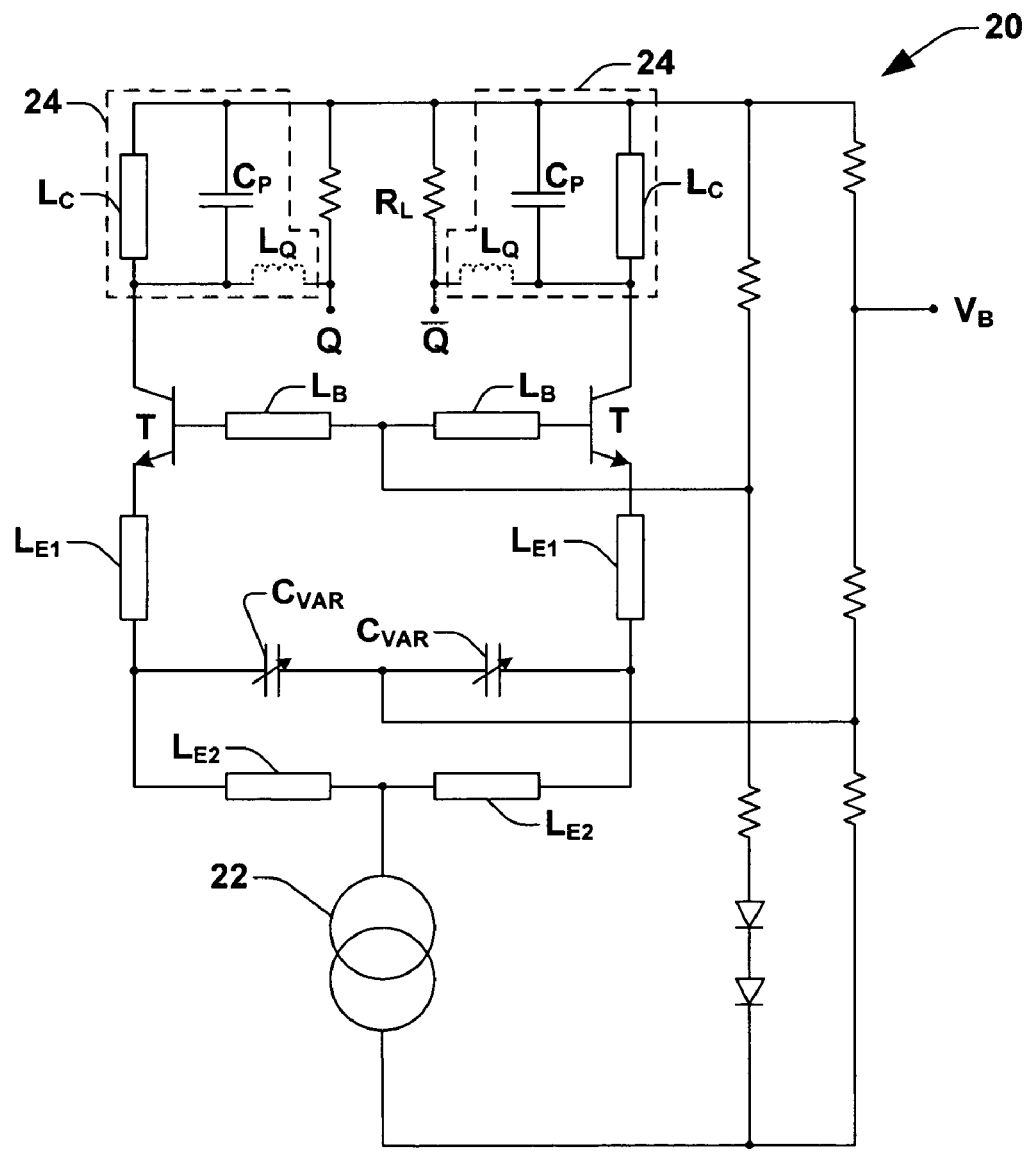
FIG. 2 is a schematic diagram illustrating a prior art LC type oscillator circuit.
Figure 3:
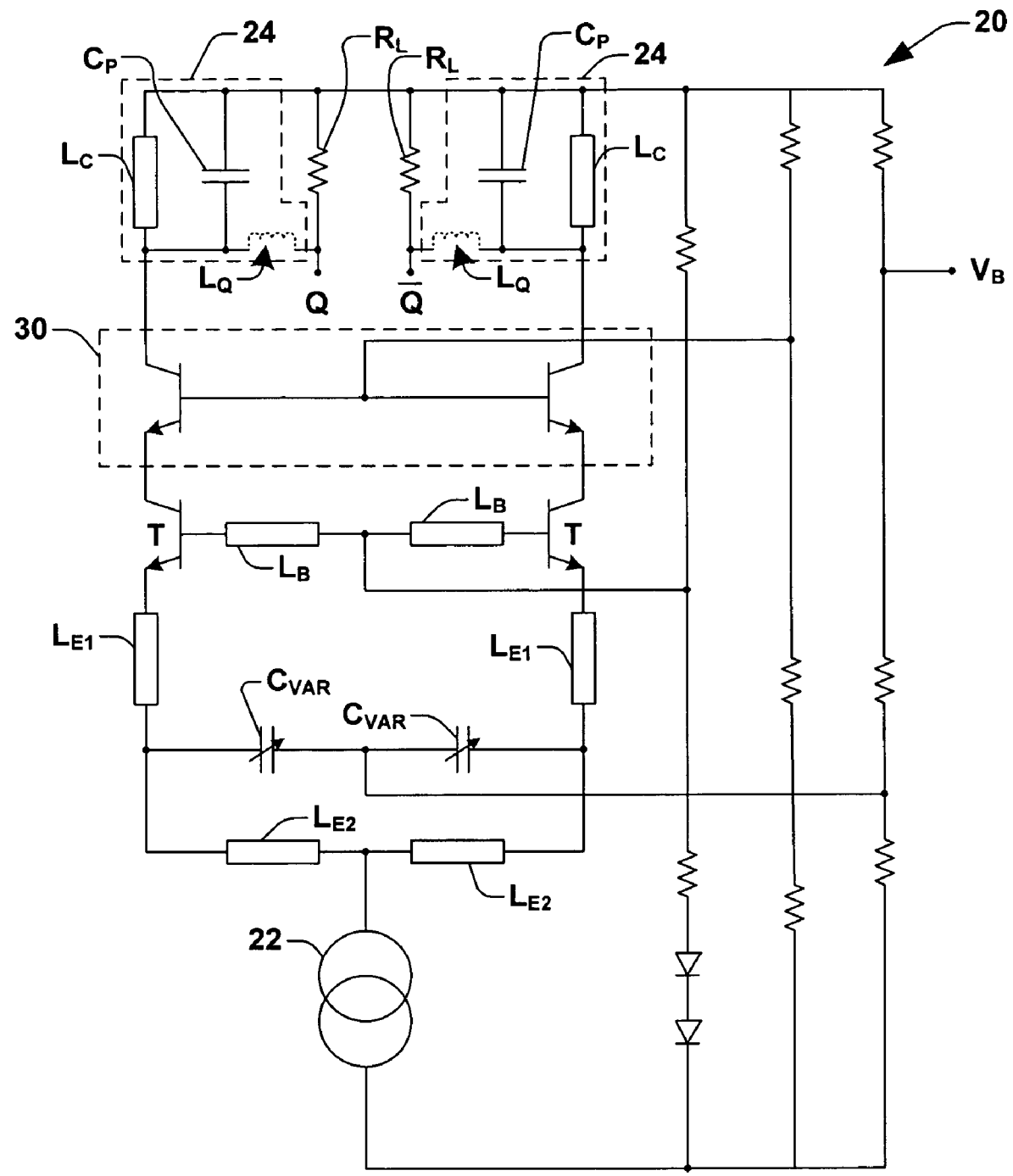
FIG. 3 is a prior art schematic diagram illustrating the prior art LC type oscillator circuit of prior art FIG. 2 incorporating a rudimentary output buffer circuit.
Figure 4:
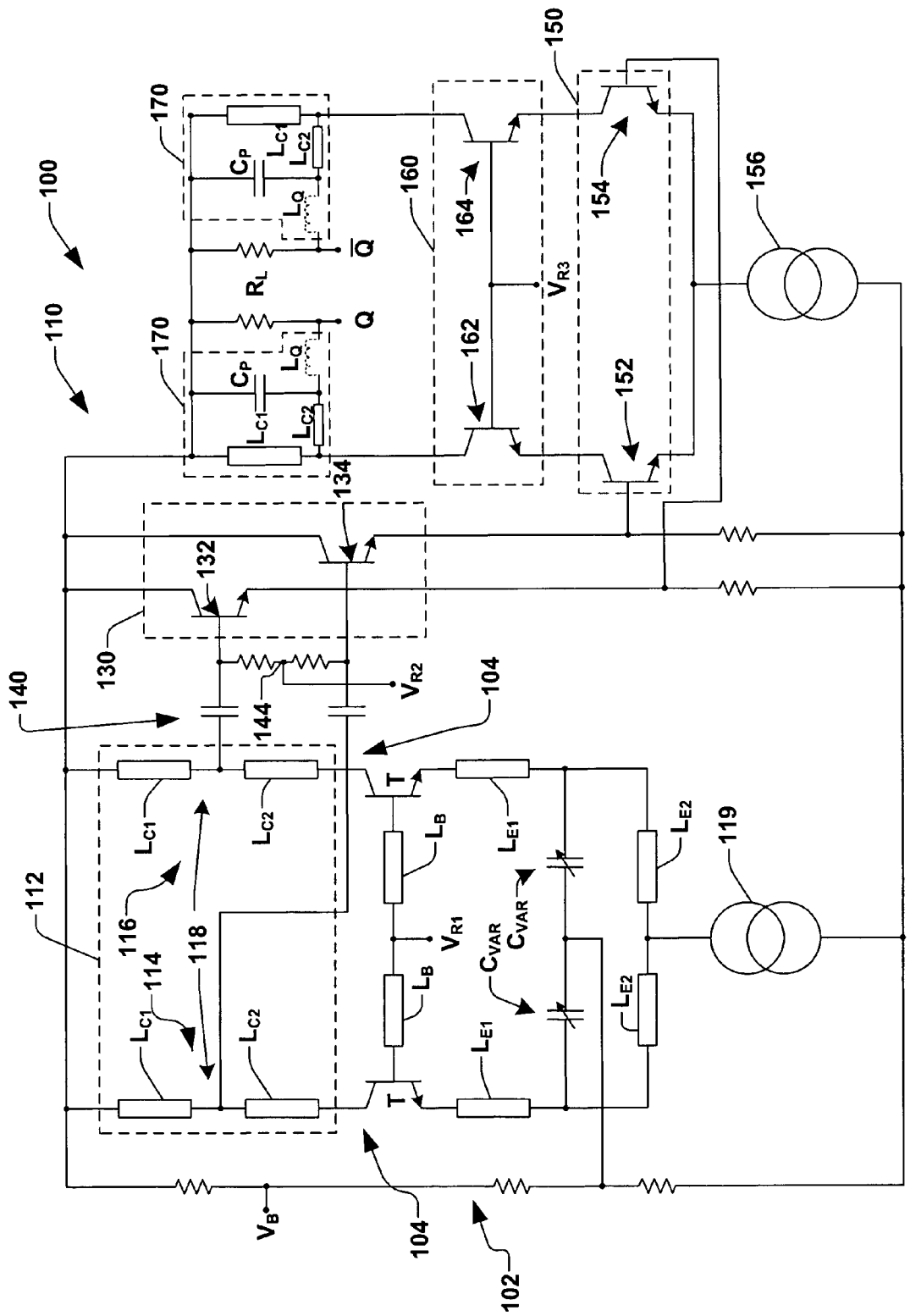
FIG. 4 is a schematic diagram illustrating an oscillator system according to one aspect of the present invention wherein an oscillator circuit has an output buffer coupled thereto.

The oscillator system of the present invention is illustrated in FIG. 4, and designated at reference numeral 100. The system 100 includes an oscillator circuit 102 having a differential signal output at 104. The oscillator circuit 102 of the present example is similar to the oscillator circuit 20 of prior art FIG. 2, however, any type oscillator circuit may be employed and is contemplated as falling within the scope of the present invention. The oscillator circuit 102 operates to provide a differential output signal at the outputs 104 that is a function of an input or bias voltage $V_B$. Thus, based on a variation in the bias voltage, a frequency at the differential outputs 104 may be varied over a predetermined frequency range. The oscillator system 100 further includes an output buffer 110 coupled to the oscillator circuit 102. Although the output buffer 110 is illustrated and described in conjunction with FIG. 4 as a plurality of elements, it should be understood that not all such elements may be required by the present invention.

The output buffer 110 of FIG. 4 comprises an inductive voltage divider circuit 112. The inductive voltage divider circuit is operable to reduce a loading at the differential output 104 of the oscillator circuit 102. In accordance with one aspect of the present invention, the inductive voltage divider circuit 112 comprises a first and second pair of series-connected inductances 114, 116 coupled to the differential output 104 of the oscillator circuit 102. An output of the circuit 112 comprises a pair of nodes 118 between the series-connected inductances, respectively. As may be appreciated, based on a relative magnitude of the inductances $L_{C1}$ and $L_{C2}$, an optimization may be made between a reduced loading on the oscillator circuit 102 and a high signal amplitude at the nodes 118. For example, for conditions where $L_{C1} > L_{C2}$ (at an optimized total inductance $L_{C1} + L_{C2}$) a high amplitude output signal from the oscillator 102 at nodes 118 is obtained at the expense of a reduced quality factor due to increased loading on the oscillator circuit. Alternatively, for conditions where $L_{C2} > L_{C1}$, a reduction in oscillator loading improves the quality factor at the expense of a reduced output signal amplitude at the nodes 118. Consequently, the inductive voltage divider circuit portion 112 of the output buffer 110 advantageously facilitates an optimization of the oscillator system 100 based on differing applications. Note that the total inductance $L_{C1} + L_{C2}$ in accordance with one example is optimized with respect to a high quality factor and signal amplitude within the oscillator core, which both reduce phase noise.

Figure 5B:
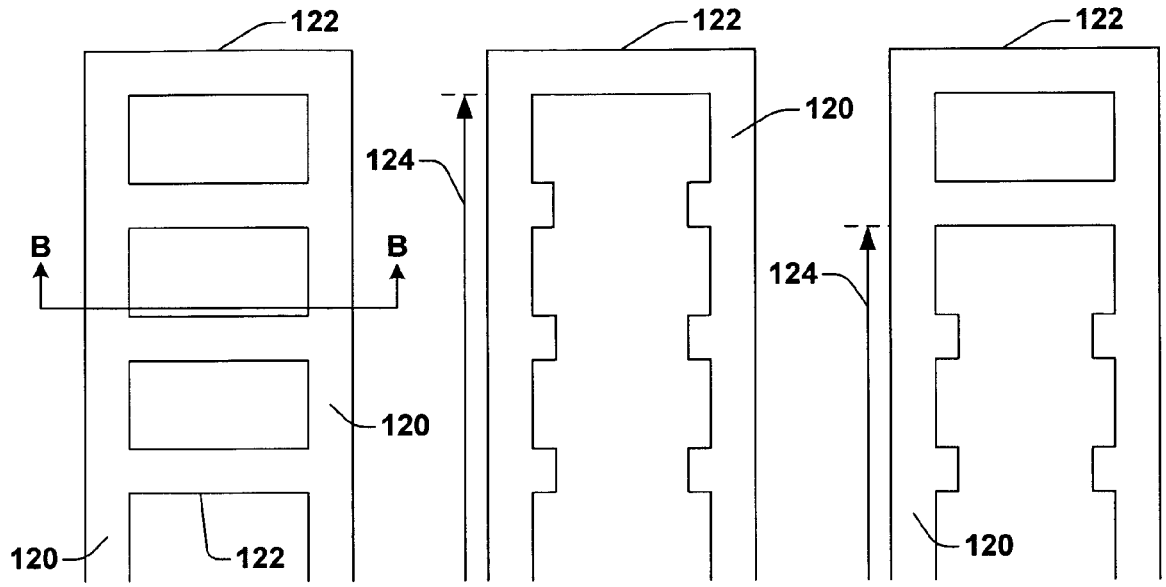
FIG. 5B is a perspective view taken along line B—B of FIG. 5A according to another aspect of the invention.
Figure 5B:
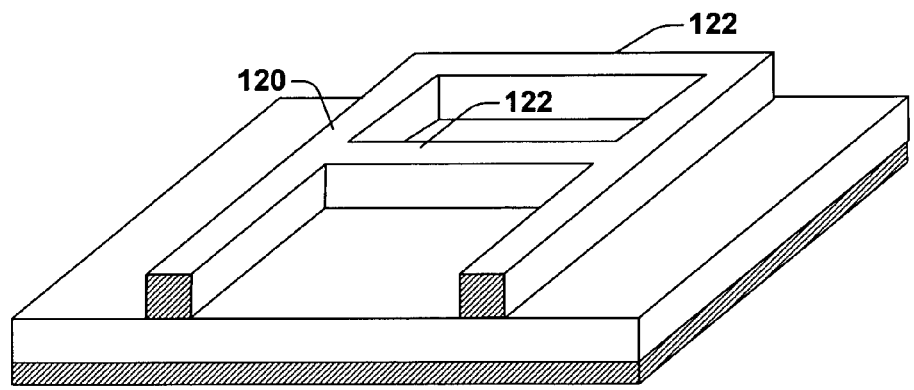

In accordance with another aspect of the present invention, the series-connected inductances $L_{C1}$ and $L_{C2}$ comprise differential micro-strip lines, for example, as illustrated in FIGS. 5A–5D. In one example, the inductances comprise substantially parallel longitudinally extending conductors 120 having a plurality of shorting conductors 122 extending thereacross. FIG. 5B illustrates a perspective view of the inductance taken along B—B of FIG. 5A. Such structures may be fabricated using conventional semiconductor manufacturing techniques as well as other techniques. In the above manner, at least a portion of the inductance exhibits a ladder-like configuration. In accordance with another aspect of the invention, a magnitude of the inductance may be varied by selectively cutting or otherwise breaking one or more of the shorting conductors 122. For example, as illustrated in FIGS. 5C and 5D, by cutting one or more of the conductors 122, a length 124 of the differential micro-strip inductance may be altered to thereby provide a fine tuning of such inductances for further optimization between loading (quality factor) and oscillator output signal amplitude.

Referring back to FIG. 4, the output buffer circuit 110 further comprises an emitter follower circuit 130 that operates to decouple the oscillator circuit output 104 or nodes 118 from succeeding stages of the output buffer. In accordance with one example, the emitter follower circuit 130 operates to provide the decoupling function between the oscillator output and any succeeding stages of the output buffer by operating as an impedance transformation circuit. It reduces the loading on the oscillator circuit by its substantially high input impedance and improves the driving condition for any succeeding stages by its substantially low output impedance, thereby improving the speed thereof. Therefore in one sense, the emitter follower circuit 130 operates as an impedance transformation stage.

In one aspect of the present invention, the emitter follower circuit 130 comprises a pair of bipolar transistors 132, 134 having base terminals coupled to a respective node 118 of the inductive voltage divider circuit 112. The transistors 132, 134 are configured in an emitter follower type arrangement, wherein a voltage at the base terminals is generally reflected at the emitter terminals thereof, wherein the emitter "follows" the voltage at the base. As may be appreciated, a degree to which the emitter follower circuit 130 operates as a decoupling and impedance transformation circuit is a function of the current gain (or beta) of the bipolar transistors. Consequently, at high frequencies (e.g., 77 GHz), as the gain of the bipolar transistors 132, 134 decreases substantially, an amount or degree of decoupling and impedance transformation provided thereby may also decrease, and in such cases further decoupling mechanisms may be advantageous within the buffer circuit 110, as will be discussed in greater detail infra.

According to another aspect of the present invention, the emitter follower circuit 130 is capacitively coupled to the inductive voltage divider circuit 112 via a coupling arrangement 140. The capacitive coupling, in one example, advantageously decouples the DC voltage associated with the high frequency differential signal at the nodes 118 from the emitter follower circuit 130. The capacitive coupling arrangement 140 further comprises a bias voltage arrangement 142 comprising, in one example, a pair of series-connected resistors having an AC or virtual ground node 144 therebetween, at which node a bias voltage $V_{R2}$ is applied. The bias voltage advantageously is set at a voltage level that prevents the bipolar transistors 132, 134 from going into quasi-saturation or saturation. This is an advantageous precondition to keep the high speed and the other valuable features of the emitter follower circuit 130. As may be appreciated, by setting an appropriate bias voltage $V_{R2}$, the base-collector P-N junction of the transistors 132, 134 is not forward biased, thereby avoiding the quasi-saturation or saturation condition.

In accordance with still another aspect of the present invention, the output buffer circuit 110 further comprises an emitter coupled pair circuit 150. The emitter coupled pair circuit 150 operates to amplify the signal and to further decouple the load $R_L$ from the oscillator circuit 102. As discussed above, at high frequencies the decoupling effectiveness of the emitter follower circuit 130 decreases. Thus it is advantageous that the emitter coupled pair circuit 150 operates to provide further decoupling.

As illustrated in the example of FIG. 4, the emitter-coupled pair circuit 150 comprises a pair of transistors 152, 154 having emitter terminals coupled together and collectively coupled to a current source circuit 156. Base terminals of the transistors are coupled to respective outputs of the emitter follower circuit 130. An output of the emitter coupled pair circuit 150 comprises the collector terminals of the bipolar transistors 152, 154.

In one example of the present invention, the emitter coupled pair circuit 150 may be employed to directly drive the load $R_L$ through a matching circuit 170. In such cases, however, in such a case the loading impedance to be driven by the emitter coupled pair circuit may be higher than would otherwise be desired. Thus, the switching of the emitter coupled pair circuit 150 may be slower than might be desired in high frequency applications. For example, the emitter coupled pair circuit 150 drives the load at a rate dictated by an RC time constant associated therewith, wherein the RC time constant is a function of the load resistance and the collector-base capacitance of the bipolar transistors 152,

154. In this configuration, the capacitance contribution of the RC time constant may be undesirably high.

Therefore in accordance with yet another aspect of the present invention, the common emitter pair circuit 150 is sped up with a base-grounded transistor circuit 160 coupled thereto (thereby forming a cascode stage) and, moreover, its decoupling capability is improved. Such performance improvement is provided by the low input impedance of the base-grounded transistor circuit 160. In one example, the base-grounded transistor circuit 160 comprises a bipolar transistor pair 162, 164 in a base-grounded configuration, wherein the base terminals of the transistors 162, 164 are coupled together to form an AC or virtual ground. In one example, an optimum bias voltage $V_{R3}$ is selected based on the targeted output signal amplitude, and is chosen to be low enough to avoid quasi-saturation or saturation of the transistors 162, 164, and high enough to avoid transistor breakdown at high signal output amplitudes. In addition, the emitter terminals are coupled to the output (collector terminals) of the transistors 152, 154 in the emitter-coupled pair circuit 150. Lastly, the collector terminals of the bipolar transistors 162, 164 form the output of the base-grounded transistor circuit 160.

The base-grounded transistor circuit 160 provides for a substantially low input impedance so that the impedance seen at the output of the emitter coupled pair circuit 150 is substantially lower than would otherwise be seen (i.e., the matched external load resistance). Consequently, although the collector-base capacitance remains nearly the same, the load resistance seen by the emitter coupled pair circuit 150 is substantially reduced, thereby improving the speed and the decoupling capability of the emitter coupled pair due to the reduced "Miller effect".

The base-grounded transistor circuit 160 still sees the external load resistance $R_L$. However, the base-grounded transistor circuit exhibits a substantially smaller influence of the collector-base capacitance compared to an emitter coupled pair with the same load impedance. This is because the collector-base capacitance of the base-grounded transistor circuit 160 connects between the output thereof and the AC or virtual ground node, wherein the collector-base capacitance of the emitter coupled pair circuit 150 is between the output and input of that circuit. Consequently, the RC time constant caused by the collector-base capacitance is substantially larger in the emitter coupled pair circuit 150 compared to the base-grounded transistor circuit 160 due to the "Miller effect". Therefore by coupling the base-grounded transistor circuit 160 to the emitter coupled pair circuit 150, a cascode stage is formed and the output buffer speed advantageously is increased substantially. Moreover, due to the fact that the collector-base capacitance does not connect the output with the input terminal, the base-grounded transistor circuit has an excellent decoupling capability.

In addition, the base-grounded transistor circuit 160 provides for improved breakdown voltage protection. SiGe bipolar transistors are advantageous for such circuits due to improved speed characteristics, however, in many instances such technology is not employed when high signal power is desired due to the reduced breakdown voltages associated therewith. For example, in the above example, the output voltage at the load $R_L$ is about 4V, wherein the usually given breakdown voltage $BV_{CEO}$ is only about 1.8V. $BV_{CEO}$ is the breakdown voltage of an emitter-grounded stage at zero base current. Fortunately, the breakdown voltage in an emitter coupled stage is substantially higher. However, the highest breakdown voltage is achieved in the base-grounded stage 160 used herein, which is driven by the emitter current. Therefore with this stage 160 maximum amplitude of the output signal and thus maximum output power is obtained.

Figure 6:
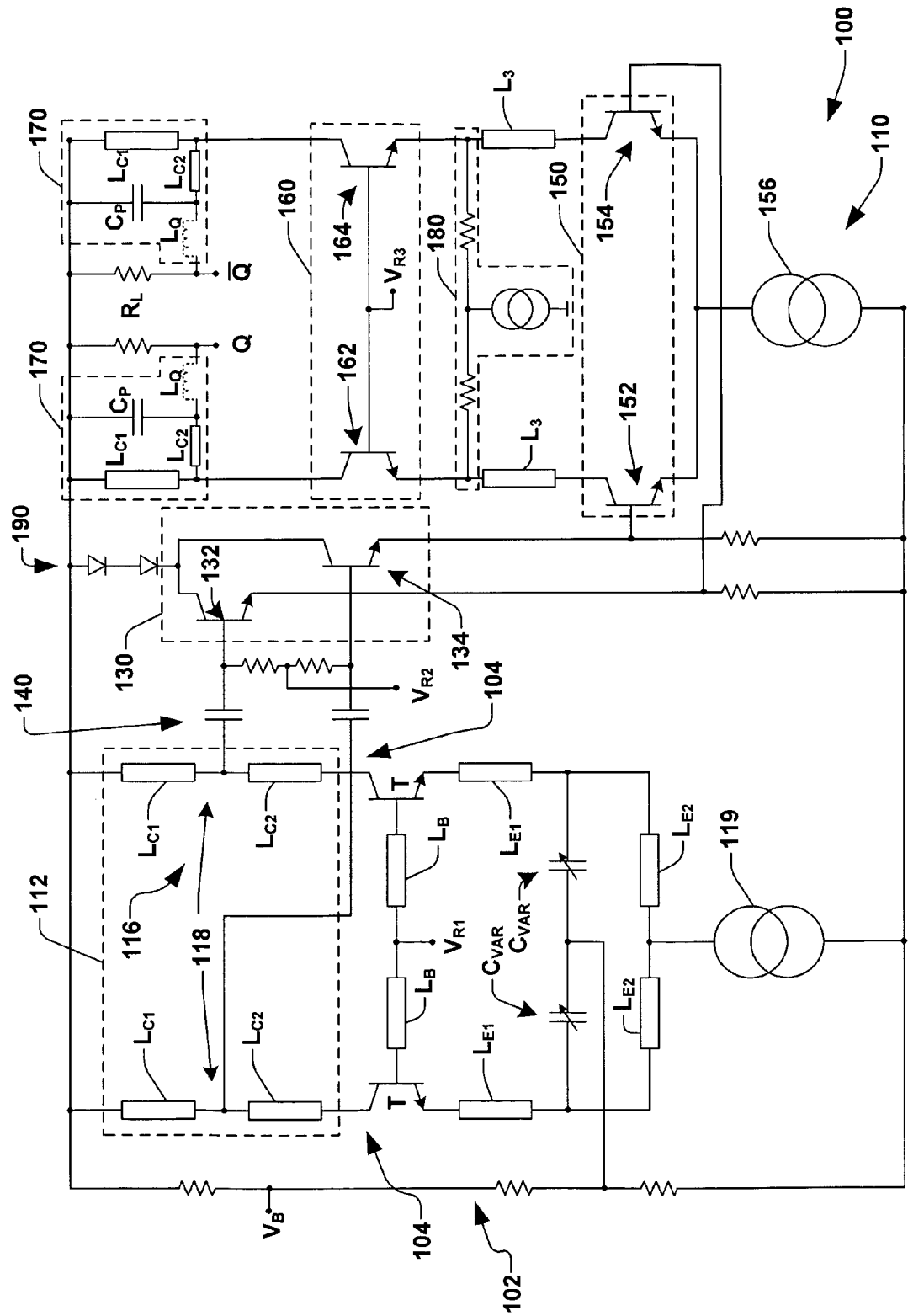
FIG. 6 is a schematic diagram illustrating an oscillator system according to another aspect of the present invention wherein an oscillator circuit has an output buffer coupled thereto.

In accordance with another aspect of the invention, the output buffer 110 may further comprise a bias current circuit 180 coupled between the emitter coupled pair circuit 150 and the base-grounded transistor circuit 160, respectively, as illustrated in FIG. 6. The bias current circuit 180 facilitates a further improvement in speed, linearity, and signal amplitude of the output buffer by, in one example, preventing the transistors 162, 164 in the base-grounded transistor circuit 160 from fully turning off, as will be described in greater detail infra.

During operation, the transistors 152, 154 of the emitter coupled stage circuit 150 are switching on and off strongly, and exhibiting a non-linear behavior. That is, although the transistors 152, 154 are typically not driven into saturation due to the bias voltage $V_{R2}$, they are turned off hard, and in such instances it takes longer to turn back on. Without the bias current circuit 180, no current is passed to the base-grounded transistor circuit 160 and the transistors 162, 164 are in turn also turned off completely. In accordance with the present invention, the bias current circuit 180 provides sufficient DC bias current so that when the transistors 152, 154 are turned off hard, the transistors 162, 164 in the base-grounded stage are kept from turning off entirely, thereby substantially improving the speed and linearity of the output buffer 110 and the signal amplitude at its output. Consequently, the bias current circuit 180 operates to prevent the base-grounded transistor circuit 160 from entering a cut-off mode of operation, and causes the base-grounded transistor circuit to operate in a more linear fashion.

In one example, the bias current circuit 180 comprises a current mirror circuit similar to circuit 156, however, any form of circuitry (e.g., a passive resistive element such as a resistor) configured to provide a sufficient DC bias current may be employed and is contemplated as falling within the scope of the present invention.

Still referring to FIG. 6, in this example, a diode arrangement 190 is coupled between a predetermined potential and the emitter follower circuit 130 in order to lower the voltage at the collectors thereof to avoid breakdown issues, as may be appreciated. These and other alternatives are contemplated by the present invention.

In still another aspect of the present invention, additional inductance $L_3$ is provided between the emitter coupled pair circuit 150 and the base-grounded transistor circuit 160. The inductances $L_3$ further improve the output power of the buffer 110 by providing improved impedance matching between the emitter coupled pair circuit 150 and the base-grounded transistor circuit 160. As a consequence, for a given driving intrinsic collector current of the emitter coupled pair circuit 150, an increase in current transfers to the base-grounded stage 160. The further inductances provide compensation of the collector-base capacitance of the emitter coupled pair circuit 150 and together form an LC resonance circuit that operates to improve the efficiency thereof.

Figure 7:
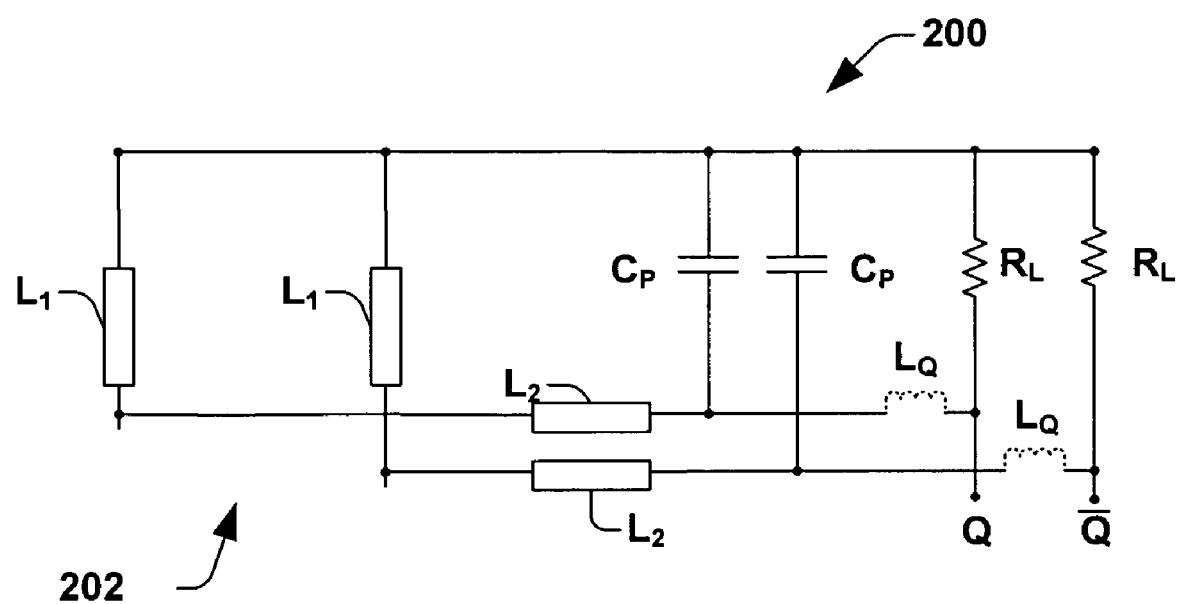
FIG. 7 is a schematic diagram illustrating a network matching the load to an output buffer of the present invention.

In yet another aspect of the present invention, the oscillator system 100 may be further improved with an adjustable matching network circuit 200, as illustrated in FIG. 7. In the matching network 200, the inductance portion 202 comprises two separate inductances $L_1$ and $L_2$ that, in one example, each comprise micro-strip lines similar to that illustrated in FIGS. 5A–5D that are trimmable for tuning thereof. For example, matching of the buffer to substantially different loads is possible. The network $L_1$ and $L_2$, in conjunction with the parasitic capacitance $C_P$ of bond pads and bonding inductance $L_Q$ operate to provide additional load matching to increase the output power.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A multi-stage output buffer having a differential input and a differential output, comprising:
    an emitter follower circuit coupled to the differential input, and configured to provide a substantially high input impedance at an input thereof, and provide a substantially low output impedance at an output thereof;
    an emitter coupled pair circuit coupled to the output of the emitter follower circuit, wherein the emitter coupled pair circuit is configured to amplify the signal and further isolate an input circuit when coupled to the differential input of the multi-stage output buffer from an external load when coupled to the differential output thereof;
    a differential base-grounded configuration transistor circuit coupled to an output of the emitter coupled pair circuit and having an output coupled to the differential output of the multi-stage output buffer, wherein the base-grounded configuration transistor circuit is configured to reduce a load impedance at the output of the emitter coupled pair circuit, thereby improving a speed and signal amplitude of the buffer;
    a bias current circuit coupled to the base-grounded configuration transistor circuit, and configured to provide a DC bias current to keep transistors in the base-grounded configuration transistor circuit from turning off when transistors in the emitter coupled pair circuit turn off, thereby further improving a speed, linearity and signal amplitude of the output buffer; and
    a first bias voltage generation circuit coupled to the emitter follower circuit, and configured to establish a first DC bias voltage at the input of the emitter follower circuit about which a differential signal varies.

2. The multi-stage output buffer of claim 1, further comprising a capacitive coupling at an input of the emitter follower circuit, wherein a capacitive coupling provides a DC isolation between the input circuit and the emitter follower circuit when the input circuit is coupled thereto.

3. The multi-stage output buffer of claim 1, wherein the first DC bias voltage comprises a voltage level that prevents one or more transistors associated with the emitter follower circuit from saturating or quasi-saturating, thereby facilitating a high speed operation of the emitter follower circuit.

4. The multi-stage output buffer of claim 1, wherein the emitter follower circuit comprises:
    a first bipolar transistor having a base terminal coupled to a first portion of the differential input; and
    a second bipolar transistor having a base terminal coupled to a second portion of the differential input,
    wherein a voltage at emitter terminals of the first and second bipolar transistors substantially follows a voltage at the base terminals thereof, wherein the voltage at the base terminals is associated with a differential signal provided at the differential input of the multi-stage output buffer.

5. The multi-stage output buffer of claim 4, wherein the emitter coupled pair circuit comprises:
    a third bipolar transistor having a base terminal coupled to an emitter terminal of the first bipolar transistor, and having an emitter terminal; and
    a fourth bipolar transistor having a base terminal coupled to an emitter terminal of the second bipolar transistor, and having an emitter terminal coupled to the emitter terminal of the third bipolar transistor emitter terminal,
    wherein a collector terminal of the third and fourth bipolar transistors form a differential output thereof.

6. The multi-stage output buffer of claim 5, wherein the base-grounded configuration transistor circuit comprises fifth and sixth bipolar transistors, wherein the fifth bipolar transistor has a base terminal coupled to a base terminal of the sixth bipolar transistor to thereby form an AC or virtual ground node thereat, and wherein an emitter terminal of the fifth and sixth bipolar transistors are coupled to respective output portions of the emitter coupled pair circuit, and wherein collector terminals of the fifth and sixth bipolar transistors form the differential output of the multi-stage output buffer.

7. The multi-stage output buffer of claim 1, wherein the base-grounded configuration transistor circuit comprises first and second bipolar transistors, wherein the first bipolar transistor has a base terminal coupled to a base terminal of the second bipolar transistor to thereby form an AC or virtual ground node thereat, and wherein an emitter terminal of the first and second bipolar transistors are coupled to respective output portions of the emitter coupled pair circuit, and wherein collector terminals of the first and second bipolar transistors form the differential output of the multi-stage output buffer.

8. The multi-stage output buffer of claim 1, wherein the bias current circuit is coupled to an input of the base-grounded configuration transistor circuit.

9. A multi-stage output buffer having a differential input and a differential output, comprising:
    an emitter follower circuit coupled to the differential input, and configured to provide a substantially high input impedance at an input thereof, and provide a substantially low output impedance at an output thereof;
    an emitter coupled pair circuit coupled to the output of the emitter follower circuit, wherein the emitter coupled pair circuit is configured to amplify the signal and further isolate an input circuit when coupled to the differential input of the multi-stage output buffer from an external load when coupled to the differential output thereof;

a differential base-grounded configuration transistor circuit coupled to an output of the emitter coupled pair circuit and having an output coupled to the differential output of the multi-stage output buffer, wherein the base-grounded configuration transistor circuit is configured to reduce a load impedance at the output of the emitter coupled pair circuit, thereby improving a speed and signal amplitude of the buffer; and a bias current circuit coupled to the base-grounded configuration transistor circuit, and configured to provide a DC bias current to keep transistors in the base-grounded configuration transistor circuit from turning off when transistors in the emitter coupled pair circuit turn off, thereby further improving a speed, linearity and signal amplitude of the output buffer, wherein the bias current circuit comprises:

a pair of series-coupled resistors connected across a differential input of the base-grounded configuration transistor circuit forming an AC or virtual ground node at a node between the series-coupled resistors; and a current source coupled between the AC or virtual ground node and a predetermined potential.

10. The multi-stage output buffer of claim 9, wherein the current source comprises a resistor.

11. The multi-stage output buffer of claim 1, wherein the multi-stage output buffer further comprises an inductance coupled between the emitter coupled pair circuit and the base-grounded configuration transistor circuit, and operable to facilitate an impedance matching therebetween.

12. The multi-stage output buffer of claim 11, wherein the inductance comprises a micro-strip transmission line.

13. A multi-stage output buffer having a differential input and a differential output, comprising:

an emitter follower circuit coupled to the differential input, and configured to provide a substantially high input impedance at an input thereof, and provide a substantially low output impedance at an output thereof;

an emitter coupled pair circuit coupled to the output of the emitter follower circuit, wherein the emitter coupled pair circuit is configured to amplify the signal and further isolate an input circuit when coupled to the differential input of the multi-stage output buffer from an external load when coupled to the differential output thereof;

a differential base-grounded configuration transistor circuit coupled to an output of the emitter coupled pair circuit and having an output coupled to the differential output of the multi-stage output buffer, wherein the base-grounded configuration transistor circuit is configured to reduce a load impedance at the output of the emitter coupled pair circuit, thereby improving a speed and signal amplitude of the buffer;

a bias current circuit coupled to the base-grounded configuration transistor circuit, and configured to provide a DC bias current to keep transistors in the base-grounded configuration transistor circuit from turning off when transistors in the emitter coupled pair circuit turn off, thereby further improving a speed, linearity and signal amplitude of the output buffer; and an inductive voltage divider circuit coupled between an input of the emitter follower circuit and the differential input of the multi-stage output buffer, and configured to weaken a loading of the input circuit when coupled thereto.

14. The multi-stage output buffer of claim 13, wherein the inductive voltage divider comprises a first and second pair of series-connected inductances coupled to the differential input of the multi-stage output buffer, wherein an output of the inductive voltage divider comprises a pair of nodes between the first and second series-connected inductances, respectively, and wherein such nodes are coupled to the input of the emitter follower circuit.

15. The multi-stage output buffer of claim 14, wherein the first and second pair of series-connected inductances each comprise:

a first differential micro-strip line having a first terminal configured to be coupled to one differential output of the input circuit; and a second differential micro-strip line having a first terminal coupled to a second terminal of the first differential micro-strip line forming one of the pair of nodes, and a second terminal coupled to a predetermined potential.

16. The multi-stage output buffer of claim 15, wherein each micro-strip line comprises a pair of substantially parallel, longitudinally extending conductors having a plurality of shorting conductors extending thereacross at differing positions along a length of the conductor pair, wherein a continuity of one or more of the shorting conductors influences a magnitude of an inductance associated therewith.

17. The multi-stage output buffer of claim 14, wherein a relative magnitude of the first and second series-connected inductances in each pair influence a balance between an amount of loading at an output of an input circuit when coupled thereto and an amplitude of a differential signal of the input circuit provided to the differential input of the multi-stage output buffer.

18. The multi-stage output buffer of claim 17, wherein the first and second pair of series connected inductances each comprise:

a first differential micro-strip line having a first terminal configured to be coupled to one differential output of the input circuit; and a second differential micro-strip line having a first terminal coupled to a second terminal of the first differential micro-strip line forming one of the pair of nodes, and a second terminal coupled to a predetermined potential.

19. The multi-stage output buffer of claim 18, wherein each micro-strip line comprises a pair of substantially parallel, longitudinally extending conductors having a plurality of shorting conductors extending thereacross at differing positions along a length of the conductor pair, wherein a continuity of one or more of the shorting conductors influences a magnitude of an inductance associated therewith.

20. The multi-stage output buffer of claim 1, further comprising an impedance matching circuit coupled between the base-grounded configuration transistor circuit and the differential output of the multi-stage output buffer, and configured to be coupled to an external load, the impedance matching circuit comprising one or more inductances per output node thereof, wherein the one or more inductances of the matching circuit comprises one or more micro-strip transmission lines.

21. The multi-stage output buffer of claim 20, wherein the micro-strip transmission lines comprise a pair of substantially parallel, longitudinally extending conductors having a plurality of shorting conductors extending thereacross at differing positions along a length of the conductor pair, wherein a continuity of one or more of the shorting conductors influences a magnitude of an inductance of the micro-strip transmission lines.

22. A multi-stage output buffer having a differential input and a differential output, comprising:
- an impedance transformation means coupled to an inductive voltage dividing means, and operable to provide a large input impedance at an input thereof and a low output impedance at an output thereof to substantially decouple any succeeding stages from an input circuit at the differential input when coupled thereto;
- a further decoupling and signal amplification means coupled to the impedance transformation means, and operable to further decouple the external load from the input circuit when coupled thereto, and to increase an output signal amplitude;
- a load impedance reducing means coupled to the further decoupling and signal amplification means, and operable to reduce a load impedance at an output of the further decoupling and signal amplification means to improve a speed and signal amplitude of the output buffer means; and
- a bias current means coupled to the load impedance reducing means, and operable to provide a current to prevent active elements associated with the load impedance reducing means from turning off when active elements associated with the further decoupling and signal amplification means turn off, thereby improving a speed, linearity and output signal amplitude of the multi-stage output buffer.

23. The multi-stage output buffer of claim 22, further comprising a loading manipulation means coupled between the differential input of the multi-stage output buffer and the impedance transformation means, and operable to reduce a loading associated with an input circuit when coupled to the differential input of the multi-stage output buffer circuit.

24. The multi-stage output buffer of claim 23, wherein the loading manipulation means comprises an inductive voltage dividing means configured to provide a differential signal that is related to a differential output signal of the input circuit when coupled thereto.

25. The multi-stage output buffer of claim 22, wherein the impedance transformation means comprises an emitter follower pair circuit.

* * * * *